(12) United States Patent
Satou et al.

(10) Patent No.: US 8,604,805 B2
(45) Date of Patent: Dec. 10, 2013

(54) PROPERTY MONITORING APPARATUS FOR CURRENT TRANSFORMER OR ELECTRIC TRANSFORMER

(75) Inventors: Kouji Satou, Niigata (JP); Toshiko Kimura, Niigata (JP); Tetsunori Watanabe, Niigata (JP)

(73) Assignee: Hitachi Industrial Equipment Systems Co., Ltd., Tokyo (JP)

( * ) Notice: Subject to any disclaimer, the term of this patent is extended or adjusted under 35 U.S.C. 154(b) by 492 days.

(21) Appl. No.: 12/823,681

(22) Filed: Jun. 25, 2010

(65) Prior Publication Data

US 2011/0148431 A1    Jun. 23, 2011

(30) Foreign Application Priority Data

Dec. 18, 2009    (JP) .................................. 2009-287389

(51) Int. Cl.
*G01R 31/06*    (2006.01)

(52) U.S. Cl.
USPC .......................................................... 324/547

(58) Field of Classification Search
None
See application file for complete search history.

(56) References Cited

U.S. PATENT DOCUMENTS

| 4,438,498 | A | * | 3/1984 | Sekel et al. ...................... 702/60 |
| 4,897,794 | A | | 1/1990 | Tsurumi |
| 5,311,762 | A | * | 5/1994 | Drexel ............................ 73/1.34 |
| 2005/0225909 | A1 | * | 10/2005 | Yoshizaki et al. ............... 361/42 |
| 2006/0085144 | A1 | * | 4/2006 | Slota et al. ....................... 702/57 |

FOREIGN PATENT DOCUMENTS

| EP | 1 586 910 A1 | 10/2005 |
| JP | 05-072311 | 3/1993 |
| JP | 10-153625 | 6/1998 |
| JP | 2001-218359 | 8/2001 |
| JP | 2002-289085 | 10/2002 |
| JP | 2002-350507 | 12/2002 |
| JP | 2003-215196 | 7/2003 |
| JP | 2004-325302 A | 11/2004 |
| JP | 2007-312445 | 11/2007 |

OTHER PUBLICATIONS

Application Note, High-Side Current-Sense Measurement: Circuits and Principles, p. 11, Fig. 12, Nov. 2001, available at http://www.maximintegrated.com/app-notes/index.mvp/id/746.*
Klaiber, et al., Which current sensor for power measurement?, Feb. 2008, available at http://www.eetimes.com/design/power-management-design/4012216/Which-current-sensor-for-power-measurement.*
Japanese Office Action issued in application No. 2009-287389 issued on Apr. 24, 2012.
European Search Report issued in application No. 10251164.9 issued on May 3, 2012.

* cited by examiner

*Primary Examiner* — Patrick Assouad
*Assistant Examiner* — Daniel Miller
(74) *Attorney, Agent, or Firm* — McDermott Will & Emery LLP

(57) ABSTRACT

The invention provides a property monitoring apparatus comprising a test current output circuit capable of varying an output current, a test current value computing means for computing a current value of a test current output from the test current output circuit, a test current control means for performing feedback control of the test current value computed via the test current value computing means to a target value, a measurement current detection circuit for measuring an output current value of the current transformer or the voltage transformer when the test current controlled to the target value via the test current control means is supplied, for storing a relationship between the output current value of the current transformer or the voltage transformer and the test current value for each target value by varying the target value of the test current via a predetermined pattern, and computing a correction coefficient for correcting a property of the current transformer or the voltage transformer based on the stored relationship.

3 Claims, 4 Drawing Sheets

PROPERTY MONITORING APPARATUS FOR CURRENT TRANSFORMER OR ELECTRIC TRANSFORMER

The present application is based on and claims priority of Japanese patent application No. 2009-287389 filed on Dec. 18, 2009, the entire contents of which are hereby incorporated by reference.

BACKGROUND OF THE INVENTION

1. Field of the Invention

The present invention relates to a property monitoring apparatus for accurately monitoring the property of a current transformer or an electric transformer used for example in a measurement device, such as a zero-phase current transformer (ZCT) used in an insulation monitoring apparatus.

2. Description of the Related Art

Patent document 1 (Japanese patent application laid-open publication No. 2003-215196) and patent document 2 (Japanese patent application laid-open publication No. 2002-289085) disclose arts related to measuring a leak current in an insulation monitoring apparatus using a zero-phase current transformer (ZCT), wherein the output of the zero-phase current transformer (ZCT) is taken in to measure the leak current value.

There are multiple variations of turns and gauges in zero-phase current transformers (ZCT), and the properties differ among respective transformers. In order to realize accurate measurement, it is necessary to consider the property of the specific component and to correct the measurement value based on the property in order to obtain an accurate measurement value.

According to the prior art insulation monitoring apparatus, the property of the individual zero-phase current transformer to be used is measured in advance, and the correction value thereof is stored in a storage section of the apparatus, based on which the measurement value is corrected for a more accurate measurement. However, the zero-phase current transformers (ZCT) that can be used are restricted to those having obtained such correction values in advance.

Patent document 1 discloses superposing a test current of a fixed level having a frequency that differs from the leak current to be measured, to thereby measure the rate of change thereof so as to obtain the above-mentioned correction value.

Patent document 2 discloses outputting a test current to a tertiary winding of a zero-phase current transformer so as to generate a simulated leak current to the circuit, so as to compare the output from a secondary winding of the zero-phase current transformer in response to the simulated leak current with a theoretical value of the simulated leak current and obtain the correction value based on the difference.

Patent document 3 (Japanese patent application laid-open publication No. 10-153625) discloses a general input current detection circuit, wherein the detection value of an input current flowing to a primary side of a current transformer is corrected by the ratio of the detection value detected by flowing a reference current.

According to the prior art insulation monitoring apparatus, as described earlier, the zero-phase current transformers (ZCT) as measurement media have respectively varied properties, so that the properties of the respective zero-phase current transformers (ZCT) must be measured in advance and the correction value thereof must be stored in a storage section of the apparatus, and therefore, it is not possible to use zero-phase current transformers other than those having their properties measured in advance.

Further according to the prior art insulation monitoring apparatus, the highly accurately controlled test current is not directly passed through the zero-phase current transformer (ZCT), and therefore, the property of the zero-phase current transformer (ZCT) cannot be directly measured. Moreover, the prior art apparatus does not allow confirmation of the state of connection regarding the zero-phase current transformer being used and the operation of the leak current detection circuit in a no-load state during periodic inspection.

Therefore, the present invention aims at providing a measurement device having a correction function capable of obtaining an accurate correction value by measuring the properties of the current transformer or the voltage transformer incorporated in the measurement device of an insulation monitoring apparatus or the like regardless of the type of current transformer or voltage transformer being adopted, and capable of confirming the operation of the measurement device in the state of connection with the current transformer or the voltage transformer being used and in the no-load state during periodic inspection.

SUMMARY OF THE INVENTION

The present invention aims at solving the problems of the prior art by providing a property monitoring apparatus incorporated in a measurement device for monitoring a property of a current transformer or a voltage transformer used in the measurement device, wherein the apparatus comprises the following technical features.

(1) The apparatus comprises a test current output circuit capable of varying an output current, a test current value computing means for computing a current value of a test current output from the test current output circuit, a test current control means for performing feedback control of the test current value computed via the test current value computing means to a target value, a measurement current detection circuit for measuring an output current value of the current transformer or the voltage transformer when the test current controlled to the target value via the test current control means is supplied, a storage means for storing a relationship between the measured current value of the measurement current detection circuit and the test current value computed by the test current value computing means for each target value by varying the target value of the test current via a predetermined pattern, and a correction coefficient computing means for computing a correction coefficient for correcting a property of the current transformer or the voltage transformer based on the relationship between the test current value and the measured current value stored in the storage means.

(2) According further to the above-described property monitoring apparatus, the test current output circuit is formed as an independent member, which can be connected in a detachable manner to a main body of the measurement device.

(3) The property monitoring apparatus further comprises an inspection mode selection means, and when an inspection mode is selected, a test current having a pattern set in advance is supplied to the current transformer or the voltage transformer, and the relationship between the present test current value and the measured current value is compared with the relationship between the previous test current value and the measured current value stored in the storage means, and inspection is performed based on the comparison result.

(4) According further to the property monitoring apparatus, the measurement device is an insulation monitoring apparatus for monitoring leak current, the current transformer is a zero-phase current transformer for measuring leak current, and the apparatus further comprises a correction means for supplying the test current to pass through the zero-phase current transformer, computing and storing in the storage means a correction coefficient having added thereto an output characteristics unique to the zero-phase current transformer based on the relationship between the test current value and the measurement current value detected by the measurement current detection circuit stored in the storage means, and correcting a leak current measurement value output from the zero-phase current transformer based on the current measured by the measurement current detection circuit and the correction coefficient stored in the storage means during measurement of the leak current.

According to the technical means illustrated in above paragraph (1) of the present invention, upon monitoring the property of a current transformer or a voltage transformer used in a measurement device, an accurate test current value is supplied to the current transformer or the voltage transformer, and based on the relationship between the test current and the output current of the current transformer or the voltage transformer, the present invention enables to obtain an accurate correction coefficient corresponding to the property of the current transformer or the voltage transformer within the monitoring device and to store the same in the storage section of the monitoring device, so that highly accurate measurement can be performed regardless of the properties of the current transformer or the voltage transformer being used.

According to the technical means illustrated in above paragraph (2) of the present invention, by designing the test current output circuit as an independent body and enabling the same to be connected in a detachable manner to the main body, it becomes possible to store the correction coefficients of multiple measurement devices in the respective property monitoring apparatuses by merely changing the program in the CPU incorporated in the measurement device body.

According to the technical means illustrated in above paragraph (3) of the present invention, when an inspection mode is selected, a test current having a pattern set in advance is supplied to the current transformer or the voltage transformer even in a no-load state, and by comparing the relationship between the previous test current value and the measurement current value stored in the storage means with the relationship between the present test current value and the measurement current value, the inspection of the measurement device can be performed easily.

According to the technical means illustrated in above paragraph (4) of the present invention, regardless of the property of the zero-phase current transformer being used in the insulation monitoring apparatus, an accurate correction coefficient corresponding to the property of the zero-phase current transformer (ZCT) can be stored in the storage section of the insulation monitoring apparatus, and the leak current measurement value output by the zero-phase current transformer can be corrected using the correction coefficient, by which the accuracy of the insulation monitoring apparatus can be improved significantly.

DETAILED DESCRIPTION OF THE PREFERRED EMBODIMENTS

Now, the preferred embodiments for applying the present invention to an insulation monitoring apparatus using a zero-phase current transformer (ZCT) will be described.

Embodiment 1

Description of Configuration

Figure 1:
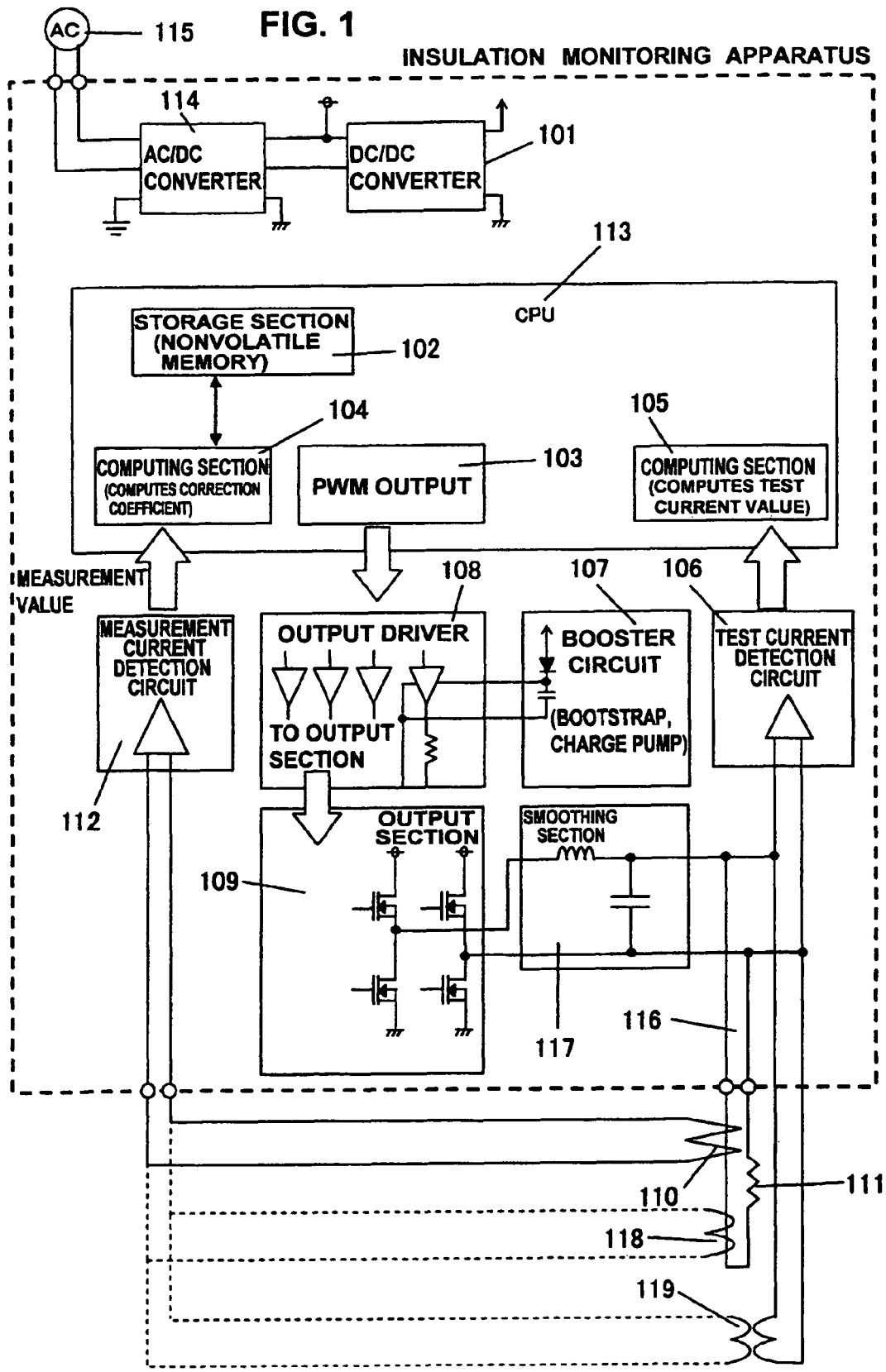
FIG. 1 is a configuration diagram of an insulation monitoring apparatus having a correction circuit incorporated therein.

FIG. 1 shows the overall configuration of an insulation monitoring apparatus.

The insulation monitoring apparatus is to be installed in an electric power substation or the like, wherein a zero-phase current transformer (ZCT) 110 is disposed on an electric path to be monitored having electric power supplied thereto from a three-phase transformer, for detecting via a measurement current detection circuit 112 a secondary current of the zero-phase current transformer (ZCT) 110 caused by the occurrence of an electric leakage, and based on the detected current value, monitoring the occurrence of electric leakage via the CPU 113.

The insulation monitoring apparatus includes an AC/DC converter section 114 and a DC/DC converter section 101 for operating the apparatus, and thereby, a DC power supply voltage is generated from a commercial power supply or the like.

The DC power supply voltage is for operating a CPU 113, an output driver 108, a test current detection circuit 106, a measurement current detection circuit 112 and an output section 109, wherein if necessary, a plurality of DC power supply voltages may be disposed according to the circuit configuration.

The CPU 113 which is primarily incorporated in the insulation monitoring apparatus is used as the control element of the insulation monitoring apparatus, and the CPU includes a computing section 104 for computing a correction coefficient described in detail later, a computing section 105 for computing the test current value, a PWM output section 103 for controlling the output, and a storage section 102 for storing the correction coefficient.

The storage section 102 can utilize an external memory capable of being inserted to and removed from the main body of the measurement device.

An output driver 108, a booster circuit 107, an output section 109 and a smoothing section 117 are disposed for outputting an AC voltage from the aforementioned DC power supply voltage, and these components constitute a test current output circuit for changing the output current according to the frequency of the PWM output section 103.

Further, a DC/DC converter for converting the power to a DC power having necessary voltage can be used as the booster circuit 107.

Moreover, the output driver section 108 is for turning the output element of the output section on, which can either adopt an insulation system or a non-insulation system selected based on the output AC voltage and safety, but if the insulation system is selected, the DC/DC converter section 101 and the test current detection circuit 106 must also adopt an insulation system.

The output section 109 uses MOSFET to constitute a half-bridge circuit. The output device can also adopt a transistor or an IGBT.

The smoothing section 117 is for smoothing the output AC voltage to form a smooth AC waveform, which is composed of an LC filter, for example.

The AC voltage output from the smoothing section 117 is supplied via an electric line 116 to a zero-phase current transformer (ZCT) 110 as test current, wherein the current value is adjusted via a resistance load 116, the current value of the test current is detected via the test current detection circuit 106, and the detected current value is sent to the CPU 113.

On the other hand, the output current of the zero-phase current transformer (ZCT) 110 accompanying the supply of test current is detected via a measurement current detection circuit 112, and the detected current value thereof is also sent to the CPU 113.

(Description of Operation)

The insulation monitoring apparatus includes a switch, which enables the apparatus to be switched between a normal insulation monitoring mode and a correction mode for supplying the test current to the zero-phase current transformer (ZCT) 110 so as to correct the property thereof.

When the correction mode is selected via the switch, the PWM output 103, the output driver 108, the booster circuit 107, the output section 109 and the smoothing section 117 are operated and an AC voltage is output.

The PWM output 103, the output driver 108, the booster circuit 107, the output section 109 and the smoothing section 117 constitute an inverter output circuit, wherein by changing the frequency setting of the PWM output 103, the output AC voltage value can be varied by changing the DC power supply voltage output from the AC/DC converter 114.

As described, since the AC voltage output from the smoothing section 117 utilizes the DC power supply voltage output from the AC/DC converter 114, the DC power supply voltage output from the AC/DC converter 114 will not fluctuate even if the AC input 115 fluctuates, so that highly accurate AC voltage can be output without being influenced by external factors.

As described, the AC voltage output from the smoothing section 117 is supplied via an electric line 116 to the zero-phase current transformer (ZCT) 110 as a test current of an effective value A, wherein the current value is adjusted via the resistance load 116 and detected via the test current detection circuit 106.

Further, the electric line 116 is passed through the zero-phase current transformer (ZCT) 110 to be subjected to property correction, but a conductor such as a bus bar can be used instead of the electric line.

The CPU 113 initially selects effective value A as the target effective value of the test current.

The test current detection circuit 106 detects the voltage value between the resistance load 111 when test current is supplied, and the detected voltage value is entered to the CPU 113, where the computing section 105 computes the effective value A of the test current based on the resistance value of the resistance load 111 and the output of the test current detection circuit 106, and performs feedback control via the PWM output 103 so that the test current value approximates the target effective value A.

As described, the effective value A of the test current uses a highly accurate AC voltage that is not influenced by external factors, and is subjected to feedback control via the CPU 113 to approximate the target value, so that an effective value A with extremely high accuracy can be obtained as the test current.

In other words, the CPU 113 constitutes a test current value computing means for computing the current value of the test current, and a test current control means for performing feedback control of the computed test current value to a target value.

The output of the zero-phase current transformer (ZCT) 110 having test current supplied thereto is entered to the CPU 113 via the measurement current detection circuit 112, where the test current value computed via the computing section 104 and the output of the zero-phase current transformer (ZCT) detected via the measurement current detection circuit 112 are subjected to comparison operation, so as to determine the correction coefficient when a test current of effective value A is supplied to the zero-phase current transformer. The determined correction coefficient is stored in the storage section 102. Further, not only the correction coefficient but also the output of the zero-phase current transformer (ZCT) 110 and the parameter for setting the frequency of the PWM output 103 are also stored simultaneously.

Next, the CPU 113 selects an effective value B that is different from the effective value A as the target effective value of the test current, wherein the frequency setting of the PWM output 103 is varied and the target value of the test current is changed to effective value B.

As for the effective value B, similar to the operation for the effective value A, a correction coefficient is determined via the correction coefficient computing section 104 based on the effective value B of the test current and the output of the measurement current detection circuit 112, and the correction coefficient is stored in the storage section 102. At the same time, the test current value and the parameter for setting the frequency of the PWM output 103 are stored.

This operation is repeated by supplying multiple test currents in the range of 1 mA to 999.9 mA, and the correction coefficients for the respective cases are stored in the storage section 102.

Figure 4:
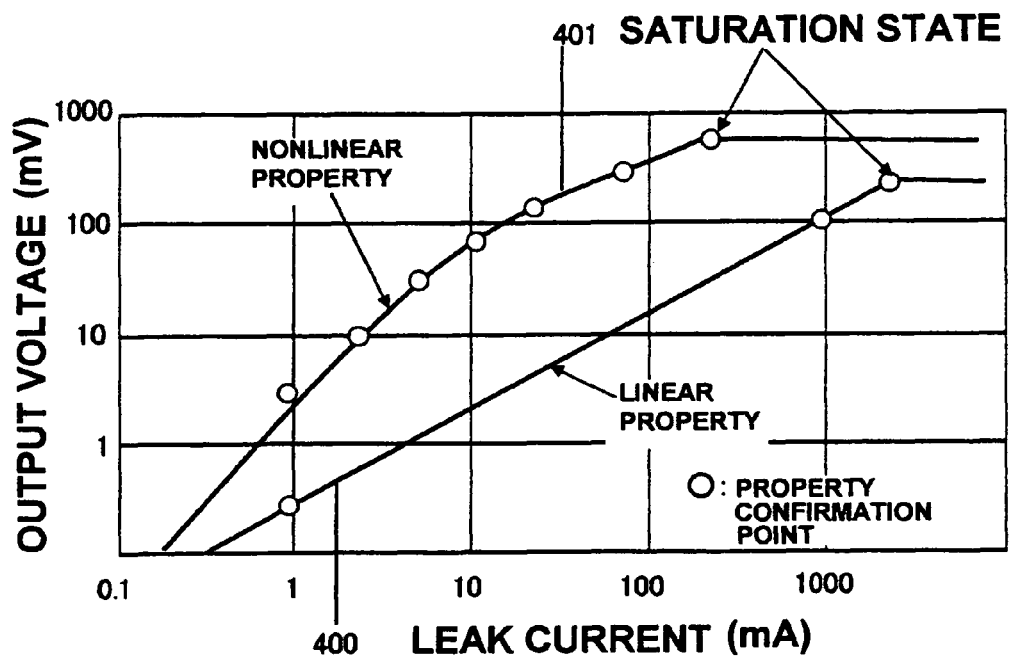
FIG. 4 is a reference diagram showing the properties of the zero-phase current transformer (ZCT).

FIG. 4 illustrates an example of the diagram showing the property of the zero-phase current transformer (ZCT), wherein when the property of the zero-phase current transformer (ZCT) is a linear property 400, the property of the zero-phase current transformer (ZCT) can be comprehended via two patterns of test currents.

On the other hand, in the case of a non-linear property 401, it is not possible to comprehend the property of the zero-phase current transformer via two patterns of test currents, so it is necessary to supply multiple patterns of test currents and compute the property via supplementation.

Therefore, the present embodiment enables to supply test currents arbitrarily within the range of 1 mA to 999.9 mA, so as to comprehend the property accurately even in the case of a nonlinear property 401, and to store the accurate correction coefficient in the storage section 102.

Thereby, as shown in FIG. 4, the saturation point in which the property of the zero-phase current transformer (ZCT) becomes saturated can also be comprehended accurately.

Further, the pattern in which the test current is flown can be varied as needed via a pattern select switch disposed on the main body of the insulation monitoring apparatus or via an external apparatus connected to the CPU 113.

Moreover, it is preferable to dispose on the main body of the insulation monitoring apparatus a display function for displaying the state of progress of the correction coefficient setting or for displaying whether the setting has been terminated correctly, and such display should utilize either a display device intrinsically disposed on the insulation monitoring apparatus or a display device additionally provided thereon.

As described, the present invention enables to compute the correction coefficient directly from the incorporated zero-phase current transformer (ZCT) 110 and store the same, so that an accurate correction coefficient corresponding to the property of the zero-phase current transformer (ZCT) 110 can be computed regardless of the type of zero-phase current transformer (ZCT) being incorporated, and the correction coefficient can be stored in the storage section 102 of the insulation monitoring apparatus so as to perform accurate insulation monitoring.

Embodiment 2

According to embodiment 1, the output driver 203, the booster circuit 202, the output section 204 and the smoothing section 205 constitute a test current output circuit for outputting a test current of a predetermined effective value in response to the demand from the CPU 113, and the test current output circuit is incorporated in the insulation monitoring apparatus, wherein the PWM output section 103, the computing section 104, the computing section 105 and the like are functions realized via the software of the CPU 113, so the only structure that must be newly disposed as hardware is the test current output circuit.

Figure 2:
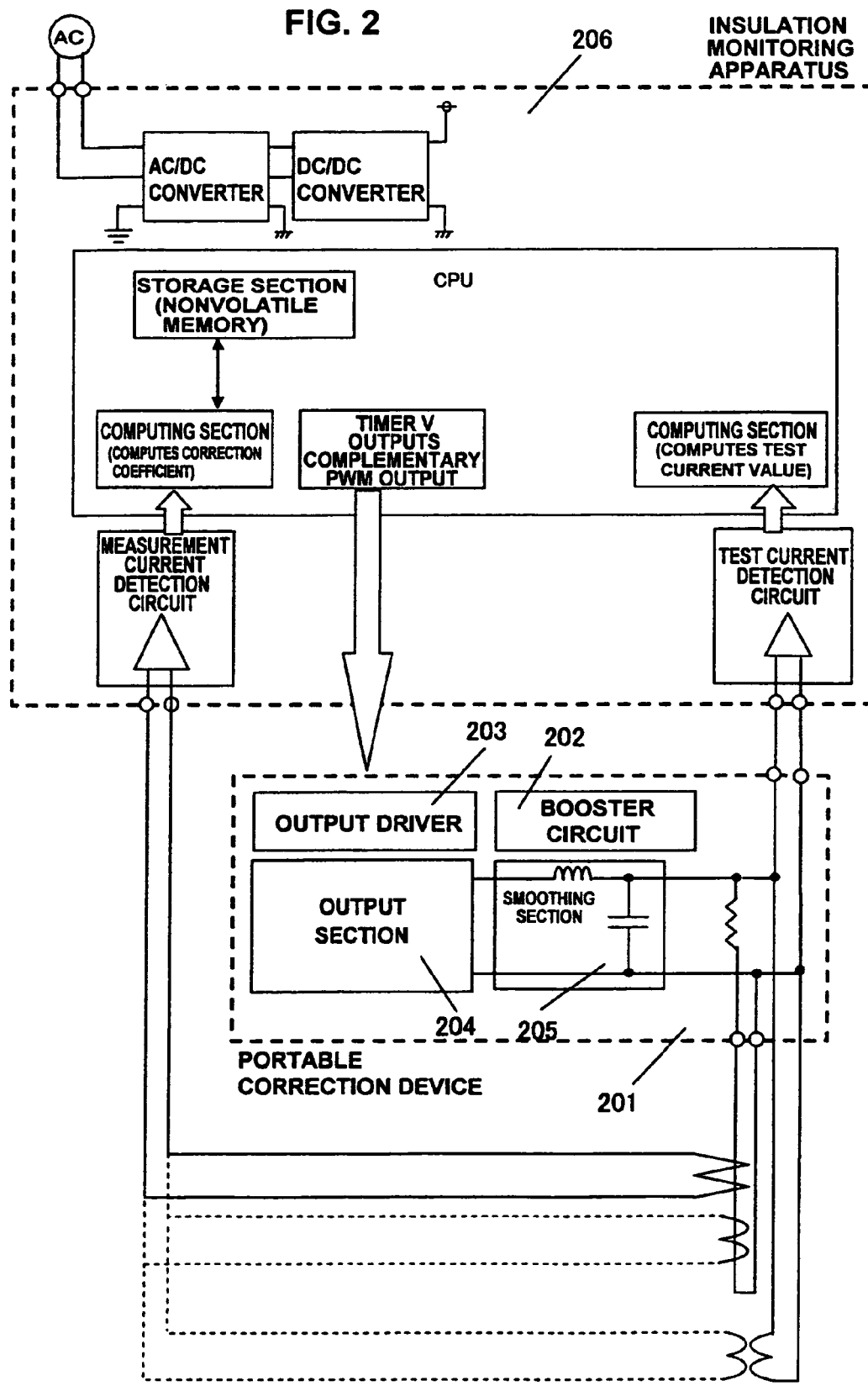
FIG. 2 is a configuration diagram showing an example in which an AC voltage output section for supplying a test current is formed as a portable correction device.
Figure 3:
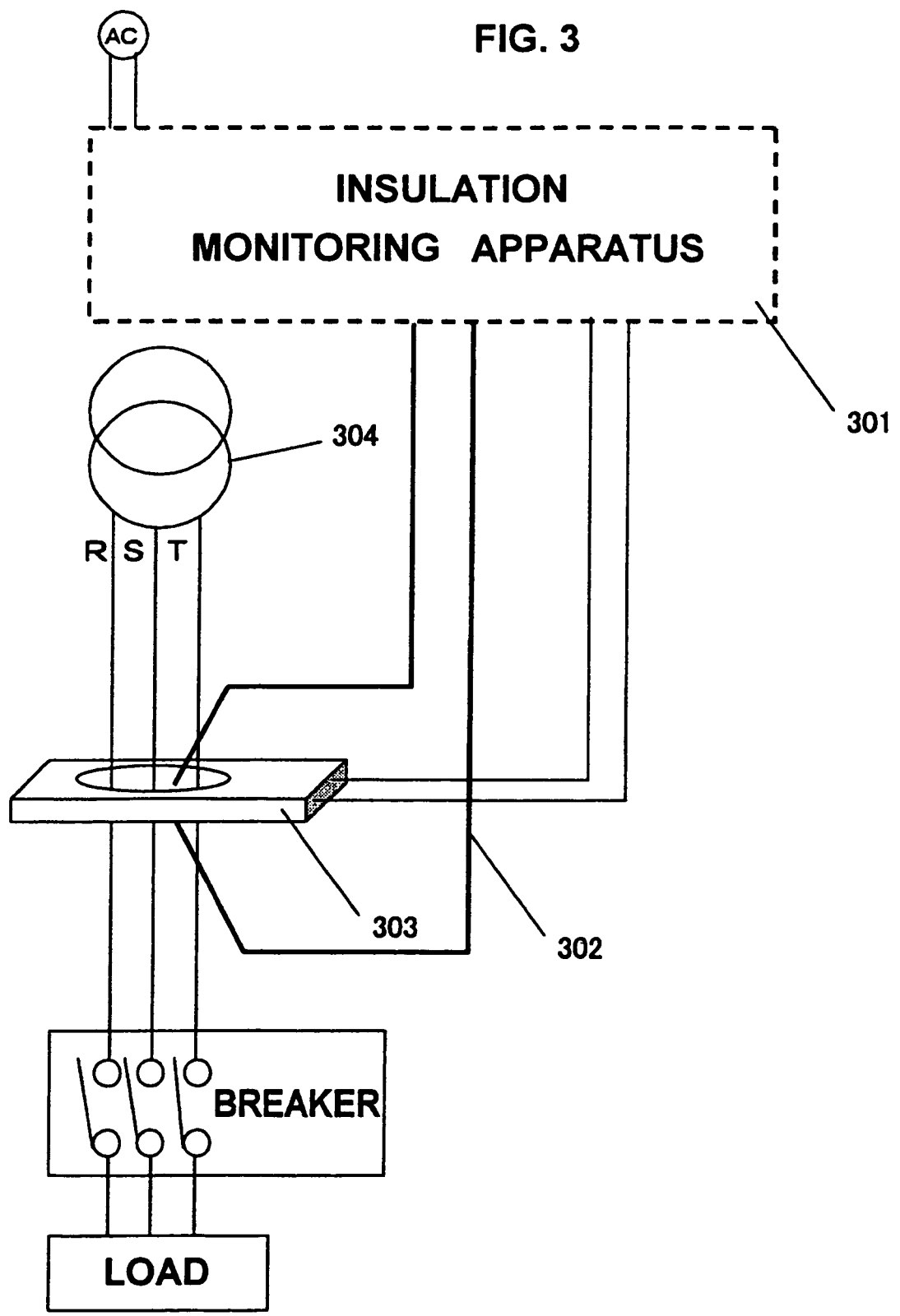
FIG. 3 is a configuration diagram showing how the inspection is performed.

Thus, according to embodiment 2, the test current output circuit composed of the output driver 203, the booster circuit 202, the output section 204 and the smoothing section 205 is formed as an independent portable correction device 201, which can be connected to a connecting section formed on the insulation monitoring apparatus only when acquiring the correction coefficient as shown in FIG. 2.

Other configurations are the same as FIG. 1.

Therefore, in order to acquire the correction coefficient, the portable correction device 201 is connected to the insulation monitoring apparatus 206, by which the CPU 113 is automatically switched to the correction mode, according to which the correction coefficient is computed via a similar operation as embodiment 1, and the data within the storage section 102 is rewritten.

When the present configuration is adopted, there is no need to provide an AC output circuit to the insulation monitoring apparatus 206, and therefore, it is possible to downsize the insulation monitoring apparatus 206. Further, even if there are a plurality of insulation monitoring apparatuses, all apparatuses can be corrected using a single portable correction device 201.

Further, it is possible to provide a correction mode switch to the portable correction device 201 and to start the above-mentioned correction by turning on the switch.

Embodiment 3

The correction function explained in embodiments 1 and 2 can be used for inspection after installing the insulation monitoring apparatus.

Since various test currents can be supplied to the insulation monitoring apparatus after installation, even if load is not connected to the main line 304, if the power supply to the load is disconnected, or if leak current is not flown, the operation and the state of connection of the zero-phase current transformer (ZCT) 303 can be confirmed.

Further, the present correction function can be used for periodic inspection.

In the example, a switch is disposed on the main body of the insulation monitoring apparatus 301 so as to switch the mode of the apparatus between the aforementioned correction mode and an inspection mode.

During the inspection mode, a frequency setting parameter is used for changing the PWM output stored in the storage unit, and a test current of a predetermined pattern is supplied from the insulation monitoring apparatus to the electric line 302.

The output of the zero-phase current transformer (ZCT) 303 at this time and the previously stored output of the zero-phase current transformer (ZCT) are compared within the insulation monitoring device, according to which the property of the zero-phase current transformer (ZCT) compared with that during the previous correction is confirmed, and thereby, it becomes possible to determine whether abnormality has occurred to the zero-phase current transformer (ZCT) or not.

Further, if the results of comparison during the respective inspections is stored as history, it becomes possible to facilitate comprehension of the past inspection dates and the property degradation of the zero-phase current transformer (ZCT) 303.

An insulation monitoring apparatus using a zero-phase current transformer (ZCT) has been described in the above-described embodiments, but the present invention capable of generating an extremely accurate AC voltage and supplying a test current to perform self correction can be applied not only to apparatuses utilizing zero-phase current transformers (ZCT) but also to measurement apparatuses utilizing current transformers (CT) 118 and voltage transformers (VT) 119.

According to the present invention, the property of not only a zero-phase current transformer (ZCT) used in an insulation monitoring apparatus but also a current transformer or a voltage transformer used in a measurement device can be corrected accurately via a property monitoring apparatus incorporated in the measurement device by only additionally providing a test current output circuit as hardware, so the measurement accuracy of the measurement device can be improved significantly at a low cost.

What is claimed is:
1. A property monitoring apparatus incorporated in a measurement device for monitoring a property of a current transformer or a voltage transformer used in the measurement device, comprising:
a test current output circuit configured to vary an output current and output a test current;
a test current value computing device configured to compute a current value of the test current outputted from the test current output circuit when the test current outputted from the test current output circuit is supplied to the current transformer or to the voltage transformer;
a test current control device configured to perform a feedback control of the test current value computed by the test current value computing device to a target value;
a measurement current detection circuit configured to measure an output current value of the current transformer or the voltage transformer when the test current controlled to the target value by the test current control device is supplied to the current transformer or to the voltage transformer;
a storage configured to store a relationship between the measured current value of the measurement current detection circuit and the test current value computed by the test current value computing device for each of a plurality of target values by varying the test current in a predetermined pattern;
a correction coefficient computing device configured to compute a correction coefficient for correcting a property of the current transformer or the voltage transformer based on the stored relationship between the computed test current value and the measured current value, and
an inspection mode selection device configured to:
select an inspection mode, and
when the inspection mode is selected, supply a test current having a pattern set in advance to the current transformer or to the voltage transformer, compare a relationship between a present test current value and a measured current value with a relationship between a previous test current value and a previous measured current value, stored in the storage, and perform an inspection based on a result of the comparison.

2. The property monitoring apparatus according to claim 1, wherein:
the test current output circuit is formed as an independent member, which is connected in a detachable manner to a main body of the measurement device.

3. The property monitoring apparatus according to claim 1, wherein:
the measurement device is an insulation monitoring apparatus for monitoring leak current,
the current transformer is a zero-phase current transformer for measuring leak current, and
the property monitoring apparatus further comprises a correction device configured to:
supply the test current to pass through the zero-phase current transformer,
compute and store in the storage a correction coefficient having added thereto an output property unique to the zero-phase current transformer based on the relationship between the test current value and the current value measured by the measurement current detection circuit, stored in the storage, and
correct a leak current measurement value outputted from the zero-phase current transformer based on the current value measured by the measurement current detection circuit and the correction coefficient stored in the storage during a measurement of the leak current.

\* \* \* \* \*